United States Patent [19]

Yuan

[11] 4,020,209

[45] Apr. 26, 1977

[54] COATED FABRICS AND LAMINATED ARTICLES THEREFROM

[75] Inventor: Edward Lung Yuan, Philadelphia, Pa.

[73] Assignee: E. I. Du Pont de Nemours and Company, Wilmington, Del.

[22] Filed: Apr. 2, 1975

[21] Appl. No.: 564,485

Related U.S. Application Data

[63] Continuation-in-part of Ser. No. 357,774, May 4, 1973, abandoned.

[52] U.S. Cl. ................................ 428/257; 427/386; 427/390 A; 427/392; 439/383 R; 428/260; 428/265; 428/267; 428/268; 428/269; 428/272

[51] Int. Cl.² ........................................ D03D 13/00
[58] Field of Search ................ 139/383 R; 428/257, 428/260, 265, 267, 268, 269, 272

[56] References Cited

UNITED STATES PATENTS

| | | | |
|---|---|---|---|
| 3,446,251 | 5/1969 | Dow | 139/383 R |
| 3,698,980 | 10/1972 | Addison | 428/265 |
| 3,705,645 | 12/1972 | Konen | 428/265 |

*Primary Examiner*—Marion E. McCamish

[57] ABSTRACT

A coated triaxial fabric, a process for its preparation and a laminated article prepared therefrom are provided. The coated fabric comprises a triaxial fabric, such as glass or polyester fibers, having a polymeric material impregnating and coating the fabric in an amount sufficient to set the yarn courses of the fabric where they cross one another and to give such a coated fabric superior isotropic tear resistance and strength (substantially uniform in all directions) when compared to a similarly constructed coated fabric prepared from a conventional biaxial fabric or a conventional bias ply construction. The coated fabric can be bonded to substrates such as metals and polymeric films.

10 Claims, 5 Drawing Figures

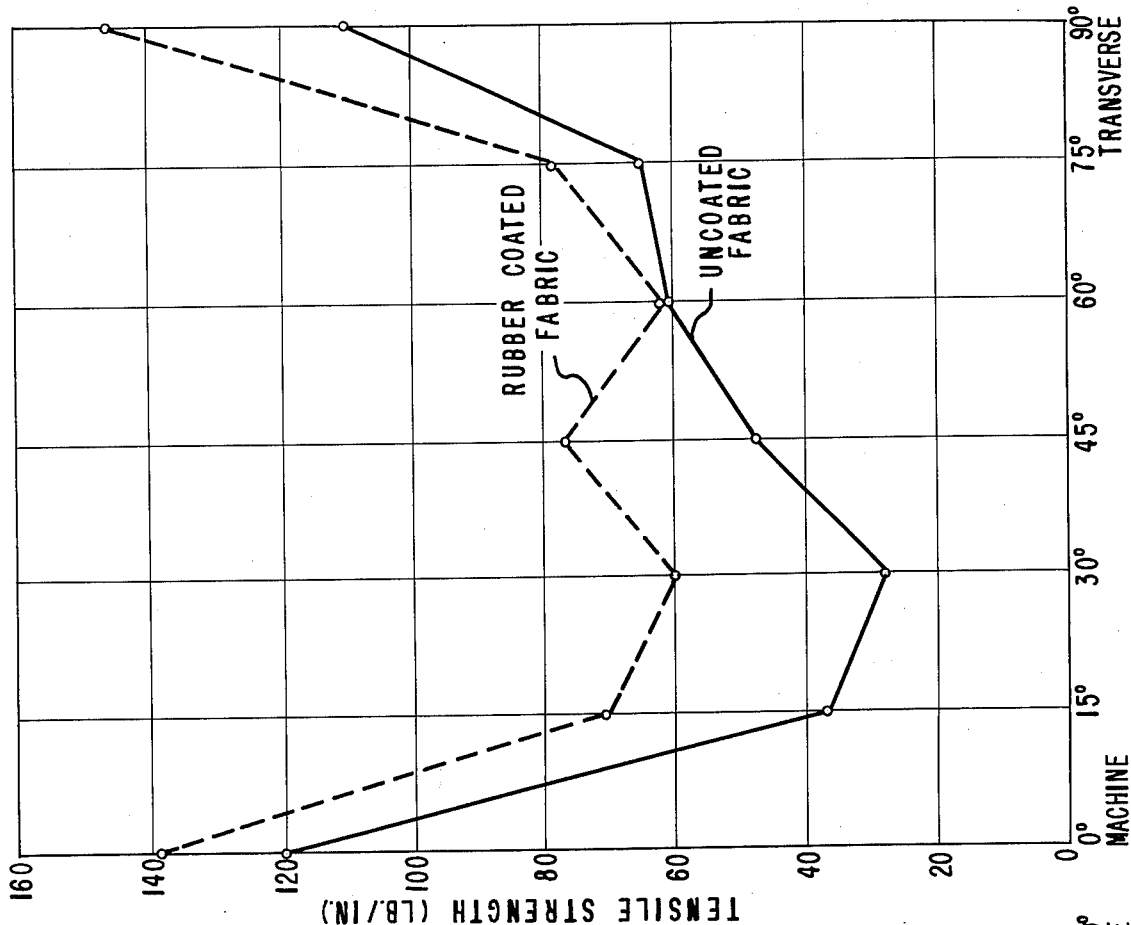
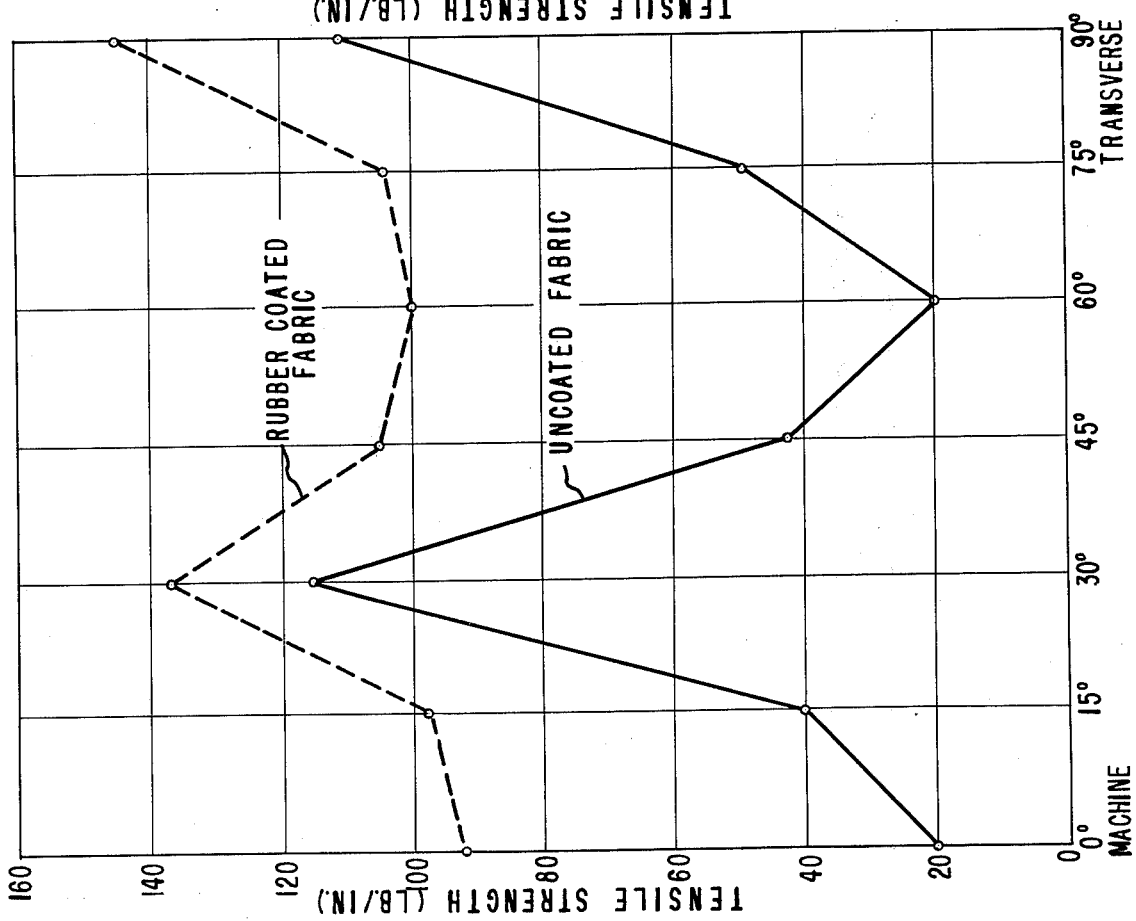

COATED FABRICS AND LAMINATED ARTICLES THEREFROM

RELATIONSHIP TO RELATED APPLICATIONS

This application is a continuation-in-part of copending U.S. application Ser. No. 357,774, filed May 4, 1973 now abandoned.

BACKGROUND OF THE INVENTION

Field of the Invention

This invention relates to coated fabrics, processes for their preparation and laminated articles prepared therefrom and more particularly to coated triaxial fabrics and laminated articles prepared therefrom.

Prior Art

The coating and impregnation of various biaxial fabrics with a variety of resins and elastomers is well known in the art. Such coated fabrics have been sold commercially for many years and have many uses. However, such coated fabrics have an inherent weakness on the bias (45° from either the warp yarns or weft yarns) which can lead to insufficient physical properties for many end-use applications. For example, tear and tear propagation resistance is one physical property which generally can be inadequate. At low coating weights, these coated fabrics may have good tear but poor bias strength and at high coating weights, the coated fabrics may have improved bias strength but poor tear. To achieve a balance of these properties, it has heretofore been necessary to laminate multiple plies oriented at different angles (bias ply constructions).

Triaxial fabrics are described in U.S. Pat. No. 3,446,251, issued May 27, 1969 to Norris F. Dow. The stated resistance to shear of these fabrics is said to be a desirable property for many end-use applications including their use as a reinforcing fabric in plastics. However, there does not appear to be much difference in isotropic strength of uncoated triaxial fabrics when compared to uncoated biaxial fabrics of similar construction and weight.

SUMMARY OF THE INVENTION

According to the present invention there is provided a coated article comprising: a triaxial woven fabric and a polymeric coating on the surface thereof, said coated fabric having:
  a. a tensile strength, measured at the weakest direction (usually 0° and 60° from machine direction) according to ASTM D-1682-64, of at least three times the uncoated fabric;
  b. a tensile strength, measured at the weakest direction (usually about 0° or 60° from the machine direction) according to ASTM D-1682-64, of at least 40% of that measured in the strongest direction, usually the transverse direction; and
  c. an average tongue tear resistance of the machine and transverse directions measured according to ASTM D-2261-64 of at least twice the tensile strength of an individual yarn used in the woven fabric.

There is also provided a laminated article prepared from the above-described coated article.

Also provided is a process for preparing the above-described coated article wherein a polymeric material is applied to a triaxial woven fabric in an amount sufficient to set the yarn courses of the fabric where they cross one another and a polymeric material is subsequently applied to the fabric with the first applied polymeric material in an amount sufficient to give the aforesaid properties. Each polymeric material is preferably applied as a dispersion or solution of the polymer in a suitable liquid carrier.

BRIEF DESCRIPTION OF THE DRAWINGS

FIG. 1 is a graph showing the tensile strength at various angles of a rubber coated polyester triaxial fabric compared to the uncoated fabric;

FIG. 2 is a graph showing the tensile strength at various angles of a rubber coated polyester biaxial fabric compared to the uncoated fabric;

DETAILED DESCRIPTION OF THE INVENTION

Figure 4:
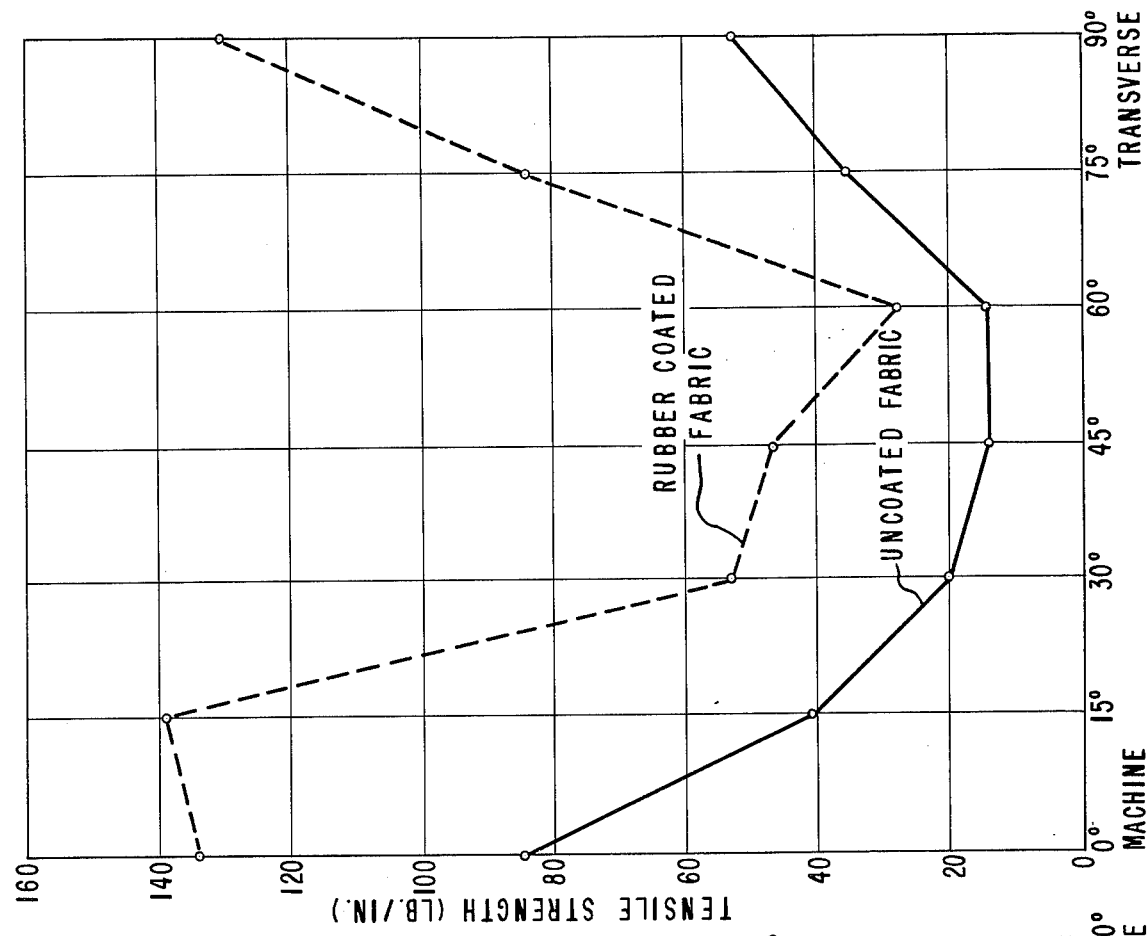
FIG. 4 is a graph showing the tensile strength at various angles of a rubber coated glass biaxial fabric compared to the uncoated fabric.

The coated fabric of the present invention is made by impregnating and coating a triaxial fabric with a polymeric composition by conventional techniques known in the art and then curing the polymer. Conventional coating techniques include dipping, brushing and spraying, but most often the fabrics will usually be coated by dipping in a polymeric dispersion and then doctoring the dispersion to give the desired coating weight.

Triaxial fabrics useful in the invention are described in U.S. Pat. No. 3,446,251, the disclosure of which is hereby incorporated by reference. These fabrics have three angularly displaced sets of parallel courses of yarns, woven so as to prevent slippage of at least one yarn course set along any other yarn course set. By varying the openness of the weave, slippage of all three yarn course sets can be varied or prevented. Thus, fabrics can be used which are fabricated within a wide range of designs and parameters of strength, density, weight, porosity and appearance.

The yarns used in the triaxial fabrics can be made of any of the materials commonly used in fiber manufacture such as cotton, wool, polyester, glass, a polyamide, an aramid, rayon or blends thereof, particularly polyester/cotton blends; however, glass and polyester (such as polyethylene terephthalate) are used in many applications. Fabric weight will depend upon the material used and the density of the weave. For example, for the preferred polyester triaxial fabrics, the preferred fabric weight will usually be in the range of 3 to 5 oz./yd$^2$, whereas for the preferred glass triaxial fabrics, the preferred fabric will usually be between 7 and 10 oz./yd$^2$. Of course, other fabric weights can be used depending upon the particular end-use application.

Any polymeric composition can be used to coat and impregnate the triaxial fabric as long as the physical properties which give the useful product of the invention are met at a reasonable coating weight, e.g., about 2 to 10 oz./yd$^2$. A preferred coating material is an elastomeric material such as nitrile rubber (a copolymer of acrylonitrile and butadiene, usually having a composition range of about 70 to 30% by weight acrylonitrile and 30 to 70% by weight butadiene), neoprene, chlosulfonated polyethylene, and ethylene/propylene, conjugated diene terpolymer. Elastomers are generally applied at a coating weight so as to give a coating to fabric weight ratio of about 0.2 to 2. Nitrile rubber is a preferred elastomer. Other preferred coating materials are an epoxy resin and an acrylic resin usually applied so as to give the same ratio. A particularly preferred acrylic resin coating composition is described in U.S. Pat. No. 3,032,521, issued May 1, 1962, to James J. Sanderson, the disclosure of which is hereby incorporated by reference. Still other preferred coating materials are polyester resins and perfluorocarbon resins.

In preparing the coated and impregnated article, it is important that the three yarn courses of the fabric where they cross one another be set, i.e., sufficient polymer be present at the yarn intersections to lock the yarns in place. If the yarn courses are not set, a coated triaxial fabric will have properties similar to a coated biaxial fabric. The yarn courses can be set in at least two ways: (1) the fabric can be impregnated with a first application of polymer in the form of a dispersion or solution which is dried to remove the liquid carrier and then a polymer applied to build the coating to the desired coating weight and fill any interstices. This subsequent coating can be applied from the same dispersion or solution or it can be applied as a hot melt or a laminated polymer film; or (2) the fabric can be thoroughly impregnated and coated in one operation — care being used so that sufficient polymer impregnates the fabric to set the yarn courses and also fill any interstices.

The coated triaxial fabrics of the invention are characterized by having:
a. a tensile strength measured at the weakest direction according to ASTM D1682-64 of at least three times the uncoated fabric,
b. a tensile strength measured at the weakest direction according to ASTM D-1682-64 of at least 50% (preferably at least 60%) of that measured in the strongest direction, and
c. an average tongue tear resistance of the machine and transverse directions according to ASTM D-2261-64 of at least twice the tensile strength of an individual yarn used in the woven fabric.

The combination of these properties is surprising since the overall properties of the uncoated triaxial fabric is not much different from a similar uncoated biaxial fabric. Also, a coating on the biaxial fabric does not appear to substantially enhance the overall tensile strength as can be seen in FIGS. 2 and 4. The coated triaxial fabrics (particularly the nitrile rubber coated fabrics) have the advantage of being able to a deep drawn with good retention of shape and only slight fabric breakage at the edge. The coated fabrics can be used where coated fabrics have heretofore been used.

Laminated articles are prepared from the coated fabrics by known techniques. This is usually accomplished simply by layering the desired materials and then applying heat and pressure sufficient to adhere the layers. The coated fabrics themselves can be laminated to a desired thickness or one or more layers of coated fabric can be bonded to at least one other substrate. Typical substrates are a metallic foil such as copper used in preparing circuit boards or a pre-formed,self-supporting film such as a polyimide film or a polyester film. A ceramic substrate can also be used.

The invention can be further understood by referring to the following examples in which parts and percentages are by weight unless otherwise indicated.

EXAMPLE 1

This example illustrates acrylic resin coated and impregnated glass and polyester triaxial fabrics and similar biaxial fabrics.

An acrylic polymer dispersion was prepared with 45% solids in water with a polymer consisting of 35% acrylonitrile, 60% butyl acrylate and 5% methacrylic acid. A phenol formaldehyde resin dispersion (5% solids) was then added to the acrylic resin dispersion and mixed. A sheet of each fabric to be coated and impregnated was dipped in this dispersion and thoroughly saturated the yarn cross-over areas of the fabrics. Both surfaces of the impregnated fabric were wiped with No. 40 wire wound rods to remove excess resin dispersion on the fabric surface. Each impregnated fabric was dried in an oven at 110° C. for about 15 minutes and then cured in a press at 160° C. and 200 lb./in.$^2$ pressure for 15 minutes. To increase or decrease the coating weight, the solids level of the dispersion was either changed or additional coatings were applied and dried, especially for the higher coating weights.

For isotropic physical property testing of uncoated and coated fabrics, 1 inch by 4 inch samples were cut in various directions and the following test methods used:
1. Tear resistance — tongue tear method ASTM D-2261-64. Measurement were made on an Instron with a crosshead gap of 1 inch and a speed of 2 inches per minute.
2. Tensile strength and elongation-cut strip tensile method ASTM D-1682-64. Conditions of the Instron were the same as in 1.

To measure tensile strength and elongation of individual yarns, the method of ASTM D-1682-64 was applied except that an individual yarn from the fabric was used.

Figure 3:
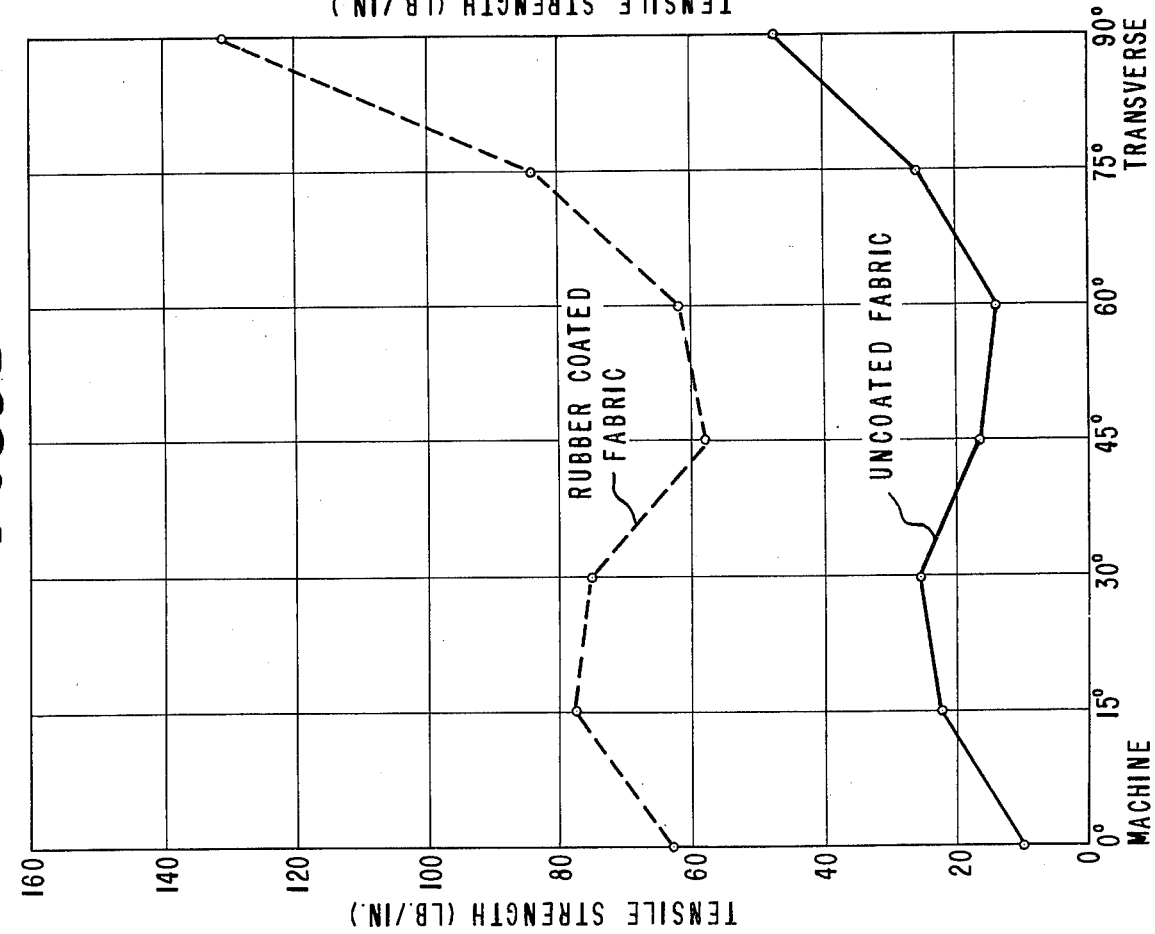
FIG. 3 is a graph showing the tensile strength at various angles of a rubber coated glass triaxial fabric compared to the uncoated fabric.
Figure 5:
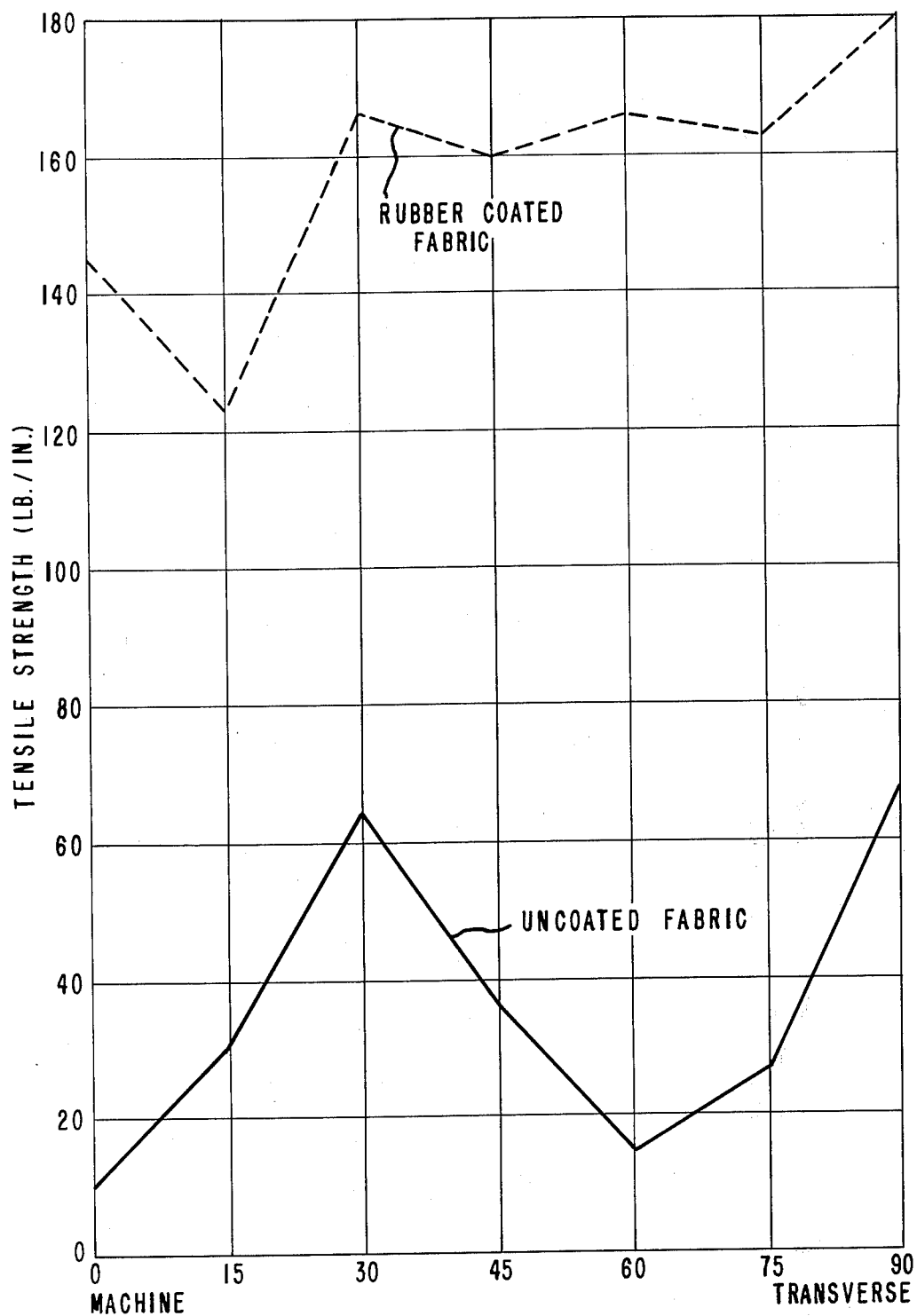
FIG. 5 is a graph showing the tensile strength at various angles of a rubber coated polyester/cotton blend triaxial fabric compared to the uncoated fabric.

The results of the physical tests are shown in Table I for various fabrics and binder/fiber ratios. Tensile properties of uncoated fabrics are shown in the drawings. FIG. 1 shows the tensile strength of the uncoated polyethylene terephthalate triaxial fabric (3.6 oz./yd.$^2$), FIG. 2 the tensile strength of the uncoated polyethylene terephthalate biaxial fabric (3.2 oz./yd.$^2$), FIG. 3 the tensile strength of the uncoated glass triaxial fabric (8.2 oz./yd.$^2$), FIG. 4 the tensile strength of the uncoated glass biaxial fabric (8.9 oz./yd.$^2$) and FIG. 5 the tensile strength of the uncoated polyethylene terephthalate/cotton blend (65/35) fabric (6.4 oz./yd.$^2$).

TABLE I

| | | | | | | | |
|---|---|---|---|---|---|---|---|
| ACRYLIC COATED AND IMPREGNATED FABRICS | | | | | | | |
| Fabric | Style | Fabric Weight (oz/yd$^2$) | Yarn Strength (lbs) | Binder/Fiber wt. ratio | Avg. Tongue Tear (lbs) | Tensile Strength | |
| | | | | | | Direction | Tensile (lbs/in) |
| Polyethylene terephthalate | Triaxial | 3.6 | 3.7 | 1.84 | 10.5 | — | — |
| " | Triaxial | 3.6 | 3.7 | 1.42 | 13 | — | — |
| " | Triaxial | 3.6 | 3.7 | 1.14 | 15 | Transverse (90°) | 275 |

TABLE I-continued

ACRYLIC COATED AND IMPREGNATED FABRICS

| Fabric | Style | Fabric Weight (oz/yd$^2$) | Yarn Strength (lbs) | Binder/Fiber wt. ratio | Avg. Tongue Tear (lbs) | Tensile Strength Direction | Tensile (lbs/in) |
|---|---|---|---|---|---|---|---|
| | | | | | | 75° | 225 |
| | | | | | | 60° | 215 |
| | | | | | | 45° | 225 |
| | | | | | | 30° | 280 |
| | | | | | | 15° | 175 |
| | | | | | | Machine (0°) | 210 |
| " | Triaxial | 3.6 | 3.7 | 0.68 | 23 | — | — |
| " | Triaxial | 3.6 | 3.7 | 0.50 | 30 | — | — |
| " | Biaxial | 3.2 | 3.5 | 1.03 | 6 | Transverse (90°) | 255 |
| | | | | | | 75° | 169 |
| | | | | | | 60° | 172 |
| | | | | | | 45° | 180 |
| | | | | | | 30° | 184 |
| | | | | | | 15° | 173 |
| | | | | | | Machine (0°) | 240 |
| " | Biaxial | 4.4 | 5.7 | 0.75 | 7.5 | — | — |

EXAMPLE 2

TABLE II

RUBBER COATED AND IMPREGNATED FABRICS

| Fabric | Style | Fabric Weight (oz/yd$^2$) | Yarn Strength (lbs) | Binder/Fiber wt. ratio | Avg. Tongue Tear (lbs) | Tensile Strength Direction | Tensile (lbs/in) |
|---|---|---|---|---|---|---|---|
| Polyethylene terephthalate (pe) | Triaxial | 3.6 | 3.7 | 0.79 | 43 | See Figure I | |
| | Biaxial | 3.2 | 3.5 | 0.40 | 24 | See Figure II | |
| Glass | Triaxial | 8.2 | 10.6 | 0.30 | 25 | See Figure III | |
| Glass | Biaxial | 8.9 | 4.0 | 0.20 | 8.5 | See Figure IV | |
| pe/cotton (65/35) | Triaxial | 6.4 | 4.6 | 1.60 | 20 | See Figure V | |

The sample procedure of Example 1 was followed except a nitrile rubber solution was used in place of the acrylic resin dispersion. The nitrile rubber was a copolymer of acrylonitrile and butadiene of medium acrylonitrile content (Paracril B sold by Uniroyal Chemical Co.) which was compounded with the usual fillers, curing agents and accelerators to give a rubber content of about 40%. The formulation was dissolved in methyl ethyl ketone at a concentration of about 25%.

Physical testing was conducted according to the procedures described in Example 1 and the results are shown in Table II. Further, the isotropic strength of the coated fabrics, prepared from uncoated fabrics referred to in Example 1 whose tensile properties are shown in FIGS. 1 to 5, are also shown in FIGS. 1 to 5.

EXAMPLE 3

The same procedure of Example 1 was followed except an epoxy resin solution was used in place of the acrylic resin dispersion. The solution was as follows:

| Ingredient | Parts |
|---|---|
| Epon 1045-A-80 (brominated epoxy resin) | 100.00 |
| Dicyandiamide | 3.50 |
| Methyl cellusolve | 28.00 |
| Benzyl dimethyl amine | 0.75 |

Physical testing was conducted according to the procedures set forth in Example 1 and the results are shown in Table III.

TABLE III

EPOXY COATED AND IMPREGNATED FABRICS

| Fabric | Style | Fabric Weight (oz/yd$^2$) | Yarn Strength (lbs) | Binder/Fiber wt. ratio | Avg. Tongue Tear (lbs) | Tensile Strength Direction | Tensile (lbs/in) |
|---|---|---|---|---|---|---|---|
| Polyethylene terephthalate | Triaxial | 3.6 | 3.7 | 1.78 | 9.5 | Transverse (90°) | 210 |
| | | | | | | 75° | 167 |
| | | | | | | 60° | 197 |
| | | | | | | 45° | 188 |
| | | | | | | 30° | 194 |
| | | | | | | 15° | 210 |
| | | | | | | Machine (0°) | 215 |
| " | Biaxial | 3.2 | 3.5 | 0.77 | 2.0 | Transverse (90°) | 225 |
| | | | | | | 75° | 164 |
| | | | | | | 60° | 160 |
| | | | | | | 45° | 175 |
| | | | | | | 30° | 158 |
| | | | | | | 15° | 176 |
| | | | | | | Machine (0°) | 225 |

TABLE III-continued

EPOXY COATED AND IMPREGNATED FABRICS

| Fabric | Style | Fabric Weight (oz/yd²) | Yarn Strength (lbs) | Binder/Fiber wt. ratio | Avg. Tongue Tear (lbs) | Tensile Strength Direction | Tensile (lbs/in) |
|---|---|---|---|---|---|---|---|
| " | Biaxial | 5.3 | 6.7 | 0.52 | 3.8 | — | — |

What is claimed is:

1. A coated article comprising: a triaxial woven fabric and a polymeric material impregnating and coating said fabric, said polymeric material present in an amount sufficient to set the yarn courses of said fabric where they cross one another and so that said coated fabric has:
    a. a tensile strength, measured at the weakest direction according to ASTM D-1682-64, of at least three times the uncoated fabric;
    b. a tensile strength, measured at the weakest direction according to ASTM D-1682-64, of at least 50% of that measured in the transverse direction; and
    c. an average tongue tear resistance of the machine and transverse directions measured according to ASTM D-2261-64 of at least twice the tensile strength of an individual yarn used in the woven fabric wherein the triaxial woven fabric is of fibers selected from the group consisting of glass, polyester, cotton, polyamide and aromatic polyamide and blends thereof;

wherein the polymeric material is selected from the group consisting of an elastomer, an epoxy resin, an acrylic resin, a polyester resin and a perfluorocarbon resin; and wherein the polymeric material to fabric weight ratio is within the range of about 0.2 to 2.

2. The coated article of claim 1 wherein the tensile strength at the weakest direction is at least 60% of that measured in the transverse direction.

3. A coated article comprising: a triaxial woven fabric of glass fibers, polyethylene terephthalate fibers or a blend of polyethylene terephthalate fibers and cotton fibers and a polymeric material impregnating and coating said fabric to a coating to fabric weight ratio within the range of about 0.2 to 2, said polymeric material impregnating the fabric so as to set the yarn courses where they cross one another and selected from the group consisting of an acrylic resin, an epoxy resin and a nitrile rubber, said coated fabric having:
    a. a tensile strength, measured at the weakest direction according to ASTM D-1682-64, of at least three times the uncoated fabric;
    b. a tensile strength, measured at the weakest direction according to ASTM D-1682-64, of at least 60% of that measured in the transverse direction; and
    c. an average tongue tear resistance of the machine and transverse directions measured according to ASTM D-2261-64 of at least twice the tensile strength of an individual yarn used in the woven fabric.

4. The coated article of claim 3 wherein the polymeric material is an acrylonitrile and butadiene copolymer.

5. A laminate article comprising: the coated article of claim 3 and at least one substrate bonded thereto.

6. The laminate of claim 5 wherein the substrate is at least one substrate selected from the group consisting of a metal and a polymeric film.

7. The laminate of claim 6 wherein the coated article is a triaxial woven fabric of glass fibers, polyethylene terephthalate fibers or a blend of polyethylene terephthalate fibers and cotton fibers and a polymeric coating on the surfaces thereof having a coating to fabric weight ratio within the range of about 0.2 to 2, said polymeric coating selected from the group consisting of an acrylic resin, an epoxy resin and a nitrile rubber, said coated fabric having:
    a. a tensile strength, measured at the weakest direction according to ASTM D-1682-64, of at least twice the uncoated fabric;
    b. a tensile strength, measured at the weakest direction according to ASTM D-1682-64, of at least 60% of that measured in the transverse direction; and
    c. an average tongue tear resistance of the machine and transverse directions measured according to ASTM D-2261-64 of at least twice the tensile strength of an individual yarn used in the woven fabric.

8. A process for preparing a coated article comprising: applying to a triaxial woven fabric a polymeric material in an amount sufficient to set the yarn courses of the fabric where they cross one another and subsequently applying a polymeric material to the fabric with the applied polymeric material to the fabric with the applied polymeric material in an amount sufficient to give a coated fabric having:
    a. a tensile strength, measured at the weakest direction according to ASTM D-1682-64, of at least three times the uncoated fabric;
    b. a tensile strength, measured at the weakest direction according to ASTM D-1682-64, of at least 50% of that measured in the transverse direction; and
    c. an average tongue tear resistance of the machine and transverse directions measured according to ASTM D2261-64 of at least twice the tensile strength of an individual yarn used in the woven fabric;

wherein the triaxial woven fabric is made of fibers selected from the group consisting of glass, polyester, cotton, polyamide and aromatic polyamide and blends thereof and the polymeric material is selected from the group consisting of an elastomer, an epoxy resin, and acrylic resin, a polyester resin and a perfluorocarbon resin.

9. The process of claim 8 wherein each polymeric material is applied from a liquid carrier and dried.

10. The process of claim 9 wherein the polymeric material is applied as an aqueous dispersion or an organic solvent solution.

* * * * *